(12) United States Patent
Adams et al.

(10) Patent No.: US 6,806,993 B1
(45) Date of Patent: Oct. 19, 2004

(54) METHOD FOR LUBRICATING MEMS COMPONENTS

(75) Inventors: Lea Adams, Plano, TX (US); Edward C. Fisher, Lucas, TX (US); Josh Malone, Plano, TX (US); Seth Miller, Sachse, TX (US); Jack C. Smith, Parker, TX (US); William Kevin Dennis, Garland, TX (US); Jeffrey W. Marsh, Murphy, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/454,075

(22) Filed: Jun. 4, 2003

(51) Int. Cl.[7] .............................................. G02B 26/00
(52) U.S. Cl. ........................ 359/291; 354/290; 438/106
(58) Field of Search ................................. 359/291, 290; 438/51, 106; 257/682, 684

(56) References Cited

U.S. PATENT DOCUMENTS

| | | |
|---|---|---|
| 4,441,791 A | 4/1984 | Hornbeck |
| 4,566,935 A | 1/1986 | Hornbeck |
| 4,662,746 A | 5/1987 | Hornbeck |
| 4,956,619 A | 9/1990 | Hornbeck |
| 5,312,882 A | 5/1994 | DeSimone et al. |
| 5,382,623 A | 1/1995 | DeSimone et al. |
| 5,451,633 A | 9/1995 | DeSimone et al. |
| 5,496,901 A | 3/1996 | DeSimone |
| 5,505,807 A | 4/1996 | Min et al. |
| 5,506,317 A | 4/1996 | DeSimone et al. |
| 5,514,759 A | 5/1996 | DeSimone et al. |
| 5,527,865 A | 6/1996 | DeSimone et al. |
| 5,530,077 A | 6/1996 | DeSimone et al. |
| 5,561,216 A | 10/1996 | De Simone et al. |
| 5,583,688 A | 12/1996 | Hornbeck et al. |
| 5,589,105 A | 12/1996 | DeSimone et al. |
| 5,610,438 A | 3/1997 | Wallace et al. |
| 5,618,894 A | 4/1997 | DeSimone et al. |
| 5,639,836 A | 6/1997 | DeSimone et al. |
| 5,672,667 A | 9/1997 | DeSimone et al. |

(List continued on next page.)

OTHER PUBLICATIONS

U.S. S/N 10/034,647 entitled "Method of Undercutting Micro–Mechanical Device with Super–Critical Carbon Dioxide" filed Dec. 8, 2001.

(List continued on next page.)

*Primary Examiner*—Scott J. Sugarman
*Assistant Examiner*—Richard Hanig
(74) *Attorney, Agent, or Firm*—Charles A. Brill; Wade James Brady, III; Frederick J. Telecky, Jr.

(57) ABSTRACT

The present invention provides, in one aspect, a method of manufacturing a MEMS assembly. In one embodiment, the method includes mounting a MEMS device, such as a MEMS mirror array, on an assembly substrate. The method further includes coupling an assembly lid to the assembly substrate and over the MEMS device to create an interior of the MEMS assembly housing the MEMS device, whereby the coupling maintains an opening to the interior of the MEMS assembly. Furthermore, the method includes lubricating/passivating the MEMS device through the opening. In addition, a MEMS assembly constructed according to a process of the present invention is also disclosed.

20 Claims, 2 Drawing Sheets

U.S. PATENT DOCUMENTS

| | | |
|---|---|---|
| 5,674,957 A | 10/1997 | DeSimone et al. |
| 5,679,737 A | 10/1997 | DeSimone et al. |
| 5,688,879 A | 11/1997 | DeSimone |
| 5,739,223 A | 4/1998 | DeSimone |
| 5,766,367 A | 6/1998 | Smith et al. |
| 5,780,553 A | 7/1998 | DeSimone et al. |
| 5,783,082 A | 7/1998 | DeSimone et al. |
| 5,824,726 A | 10/1998 | DeSimone et al. |
| 5,840,820 A | 11/1998 | DeSimone et al. |
| 5,855,819 A | 1/1999 | DeSimone et al. |
| 5,860,467 A | 1/1999 | DeSimone et al. |
| 5,863,612 A | 1/1999 | DeSimone |
| 5,866,005 A | 2/1999 | DeSimone et al. |
| 5,872,157 A | 2/1999 | DeSimone et al. |
| 5,922,833 A | 7/1999 | DeSimone |
| 5,939,501 A | 8/1999 | DeSimone et al. |
| 5,939,502 A | 8/1999 | DeSimone et al. |
| 5,944,996 A | 8/1999 | DeSimone et al. |
| 5,945,477 A | 8/1999 | DeSimone et al. |
| 5,977,292 A | 11/1999 | DeSimone et al. |
| 5,981,673 A | 11/1999 | DeSimone et al. |
| 6,001,418 A | 12/1999 | DeSimone et al. |
| 6,010,542 A | 1/2000 | DeYoung et al. |
| 6,024,801 A | 2/2000 | Wallace et al. |
| 6,025,459 A | 2/2000 | DeSimone et al. |
| 6,083,565 A | 7/2000 | Carbonell et al. |
| 6,107,443 A | 8/2000 | DeSimone et al. |
| 6,127,000 A | 10/2000 | Carbonell et al. |
| 6,147,790 A | 11/2000 | Meier et al. |
| 6,176,895 B1 | 1/2001 | DeSimone et al. |
| 6,211,422 B1 | 4/2001 | DeSimone et al. |
| 6,224,774 B1 | 5/2001 | DeSimone et al. |
| 6,240,936 B1 | 6/2001 | DeSimone et al. |
| 6,242,165 B1 | 6/2001 | Vaartstra |
| 6,248,136 B1 | 6/2001 | McClain et al. |
| 6,277,753 B1 | 8/2001 | Mullee et al. |
| 6,288,202 B1 | 9/2001 | DeSimone et al. |
| 6,298,902 B1 | 10/2001 | DeSimone et al. |
| 6,306,564 B1 | 10/2001 | Mullee |
| 6,323,982 B1 | 11/2001 | Hornbeck |
| 6,660,552 B2 * | 12/2003 | Payne et al. .......... 438/48 |

OTHER PUBLICATIONS

Supercritical Carbon–dioxide Cleaning Technology Review, http://www.pprc.org/pprc/p2tech/co2/co2intro.html (Jul. 1996).

Technical Issue and CO2–based Cleaning Systems, http://www.pprc.org/pprc/p2tech/co2/co2tech.html (Jul. 1996).

McClain et al, Design of Nonionic Surfactants for Supercritical Carbon Dioxide, Science, vol. 274 (Dec. 1996).

Biberger et al, Photoresist and Photoresist Resiue Removal with Supercritical Co2—A Novel Approach to Cleaning Wafers, Semiconductor Fabtech, 12th Edition (Jul. 2000).

Jafri et al., Critical Point Drying and Cleaning for MEMS Technology, Part of the SPIE Conference on MEMS Reliability for Critical and Space Applications, SPIE vol. 3880 (Sep. 1999).

* cited by examiner

METHOD FOR LUBRICATING MEMS COMPONENTS

TECHNICAL FIELD OF THE INVENTION

Disclosed embodiments herein relate generally to micro electro-mechanical systems (MEMS) assemblies, and, more specifically, to methods for lubricating internal MEMS assembly components during the manufacturing process using an opening in the MEMS assembly package.

BACKGROUND OF THE INVENTION

Optoelectronic devices have continued to gain popularity with today's top manufacturers. Specifically, micro electro-mechanical devices, such as actuators, motors, sensors, and micro electro-mechanical systems (MEMS), such as spatial light modulators (SLMs), are some of the few types of optoelectronic devices gaining in use. Such packaged SLMs and other types of MEMS devices are employable in "digital micro-mirror device" (DMD) technology, of the type designed and used by Texas Instruments of Dallas, Tex.

Such DMD MEMS assemblies include arrays of electronically addressable mirror elements (or "pixels"), which are selectively movable or deformable. Each mirror element is movable in response to an electrical input to an integrated addressing circuit formed monolithically with the addressable mirror elements in a common substrate. Such MEMS assemblies modulate incident light in a spatial pattern, pursuant to an electrical or other input, in phase, intensity, polarization or direction. The incident light is modulated by reflection from each mirror element.

Unfortunately, defects may be caused by contamination of the MEMS mirror array during various stages of the manufacturing process. For example, at certain points, the MEMS array may be stripped of any protective layer, exposing the MEMS array to contaminates before it is sealed within the MEMS assembly. More particularly, contaminants, often in the form of debris particles, may contaminate the mirror array during the wafer saw process, array mounting stage, wire-bonding processes, and even the during the final assembly stage for the MEMS assembly. Such contamination may detrimentally affect the function of the mirror, and as the number of defects increases, so too does the overall manufacturing costs due to decreased wafer yield.

BRIEF SUMMARY OF THE INVENTION

To address the above-discussed deficiencies of the prior art, the present invention provides, in one aspect, a method of manufacturing a MEMS assembly. In one embodiment, the method includes mounting a MEMS device, such as a MEMS mirror array, on an assembly substrate. The method further includes coupling an assembly lid to the assembly substrate and over the MEMS device to create an interior of the MEMS assembly housing the MEMS device, whereby the coupling maintains an opening to the interior of the MEMS assembly. Furthermore, the method includes lubricating/passivating the MEMS device through the opening.

In another aspect, the present invention provides a MEMS assembly constructed according to a process of the present invention. In one embodiment, the MEMS assembly is constructed by mounting a MEMS device, such as a MEMS mirror array, on an assembly substrate. The MEMS assembly is further constructed by coupling an assembly lid to the assembly substrate and over the MEMS device to create an interior of the MEMS assembly housing the MEMS device, whereby the coupling maintains an opening to the interior of the MEMS assembly. Furthermore, the MEMS assembly is constructed by lubricating/passivating the MEMS device through the opening.

BRIEF DESCRIPTION OF THE DRAWINGS

For a more complete understanding of the present invention, reference is now made to the following detailed description taken in conjunction with the accompanying drawings. It is emphasized that various features may not be drawn to scale. In fact, the dimensions of various features may be arbitrarily increased or reduced for clarity of discussion. Reference is now made to the following descriptions taken in conjunction with the accompanying drawings, in which.

DETAILED DESCRIPTION OF THE INVENTION

Figure 1:
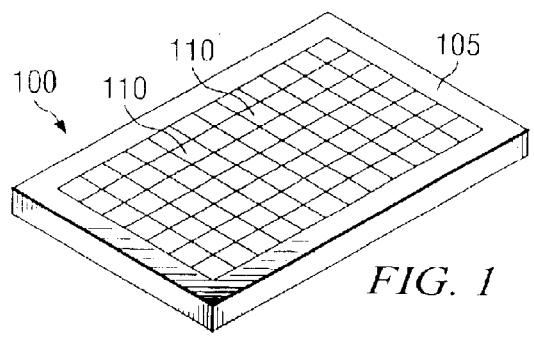
FIG. 1 illustrates an isometric view of one embodiment of a MEMS array for use with one embodiment of a method of manufacturing MEMS assemblies of the present invention.

Referring initially to FIG. 1, illustrated is an isometric view of one embodiment of a micro electro-mechanical system (MEMS) mirror array 100. The illustrated MEMS mirror array 100 includes a semiconductor substrate 105 on which a plurality of MEMS mirrors 110, as well as other associated components, are formed. The MEMS array 100 may have, for example, several thousands, or even hundreds of thousands, of mirrors 110 formed thereon. Examples of MEMS structures and manufacturing methods have been developed and described by Texas Instruments of Dallas, Tex., including "digital micro-mirror device" (DMD) technology.

In function, the mirrors 110 formed on the MEMS array 100 reflect beams of light, therefore modulating the light, by moving or rotating on one or more relatively thin, integral supporting beams or hinges. Depending on the type of beams or hinges formed, the mirrors 110 may be a cantilever design or may be supported by one or more torsion beams or flexure beams, depending on the desired application. Deflection of each mirror 110 is effected by the attractive electrostatic force exerted on a portion of the mirrors 110 by an electrical field resulting from a potential applied to an associated control electrode located beneath each of the mirrors 110 and formed on the substrate 105. The potential is selectively applied to the control electrode by an addressing circuit formed in the semiconductor substrate 105 beneath the mirrors 110.

When a mirror 110 is deflected to a first position according to a voltage applied to the control electrodes by the addressing circuit, the mirror 110 reflects light along a first path to a first site. However, when the addressing circuit applies a different voltage to the underlying electrodes, the mirror 110 is electrostatically attracted to a second position whereby it reflects light along a second path, different from the first path, thus redirecting the light to a different site. From the foregoing, the incident light is modulated by the mirrors 110 in the MEMS array 100 so that it selectively reaches the first or second site, whichever contains the desired target of the beam of light.

Figure 2A:
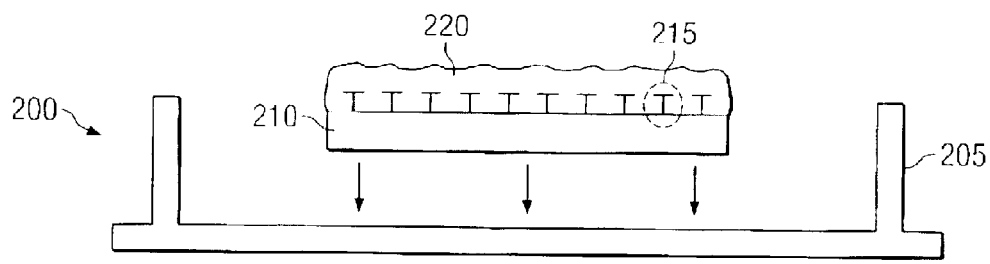
FIG. 2A illustrates a side section view of the MEMS assembly during an initial stage of the manufacturing process of the present invention.

Turning now to FIGS. 2A–2D, illustrated are side section views of a MEMS assembly 200 throughout various stages of a manufacturing process according to the principles disclosed herein. More specifically, beginning with FIG. 2A, illustrated is the MEMS assembly 200 during an initial stage of one embodiment of a manufacturing process. The MEMS assembly 200 includes an assembly substrate 205 on which a MEMS device, in this example a MEMS mirror array 210, is shown being mounted. As discussed above, the MEMS array 210 includes a plurality of mirrors 215 for modulating an incoming beam or beams of light in the manner described above.

Also as shown in FIG. 2A, the MEMS array 210 includes a sacrificial protective layer 220 formed thereon. Among other things, the protective layer 220 provides protection for the mirrors 215 from contaminants that might otherwise reach the MEMS array 210. If contaminants are allowed to reach and affect the MEMS array 210, the yield of good devices from the wafer from which the MEMS array 210 was cut potentially decreases. The protective layer 220 may be blanket-deposited over the MEMS array 210 while it is still joined with other arrays to form the semiconductor wafer. In one embodiment, the protective layer 220 is a photoresist, but other types of protective layers 220 may also be employed.

Figure 2B:
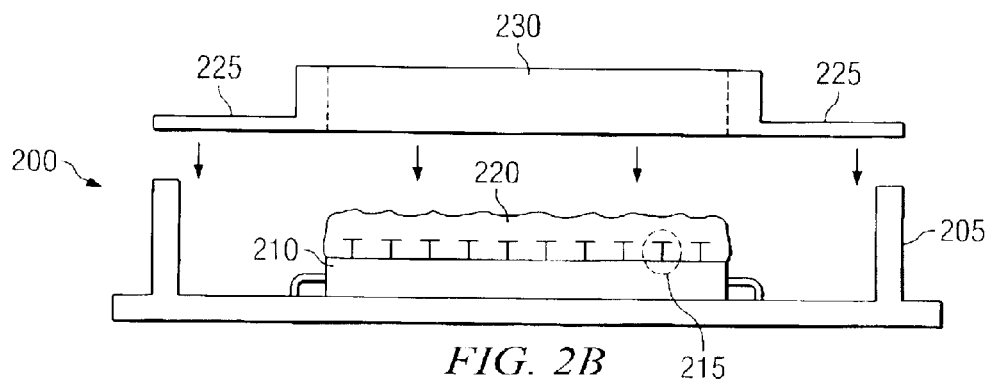
FIG. 2B illustrates the MEMS assembly of FIG. 2A during another stage in the manufacturing process.

Looking now at FIG. 2B, illustrated is the MEMS assembly 200 of FIG. 2A during another stage in the manufacturing process. Specifically, an assembly lid 225, having a window 230 for incident light to pass through and reach the MEMS array 210, is shown being mounted onto the assembly substrate 205 and over the MEMS array 210. The mounting of the lid 225 creates an interior of the MEMS assembly 200, in which the MEMS array 210 is now located. However, removing the protective layer 220 from the MEMS array 210 before the assembly lid 225 is coupled to the substrate 205 would leave the MEMS array 210 exposed to potential contaminants. As a result, in one embodiment of the present invention, the assembly lid 225 is coupled to the substrate 205 prior to the removal of the protective layer 220.

Figure 2C:
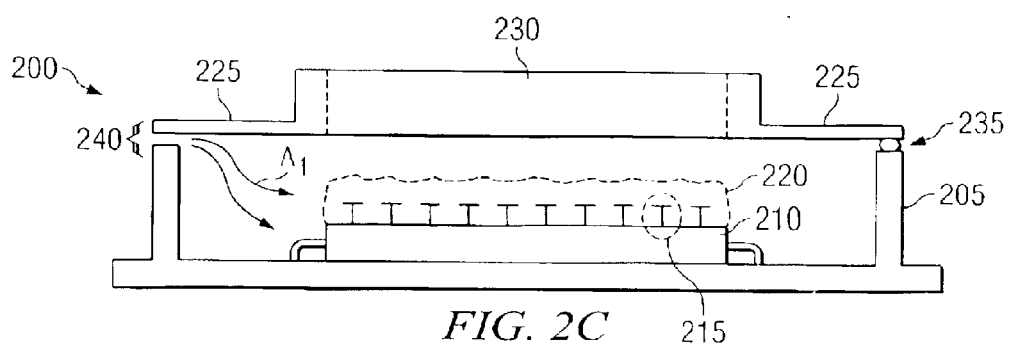
FIG. 2C illustrates the MEMS assembly later in the manufacturing process.

Referring now to FIG. 2C, illustrated is the MEMS assembly 200 later in the manufacturing process. As illustrated, the assembly lid 225 has been coupled or affixed to the assembly substrate 205. Specifically, in this embodiment, the assembly lid 225 has been tack-welded to the substrate 205, as shown by the tack-weld bead 235 on the right side of the MEMS assembly 200. Since the assembly lid 225 has only been tack-welded to the assembly substrate 205, openings or vents 240 remain along different portions of the MEMS assembly 200, where the lid 225 and the substrate 205 meet but are not welded. Other techniques for leaving such openings 240 include applying a non-continuous bead of adhesive between the substrate 205 and the lid 225. Although only one opening 240 is illustrated in FIGS. 2A–2D, several openings 240 between the assembly lid 225 and the assembly substrate 205 may be prevalent, for example, via the spaces between multiple tack welds, until the two are permanently sealed together towards the end of the manufacturing process.

Once the MEMS assembly 200 is tack-welded, or otherwise partially coupled together, the entire assembly may be moved to a different station that has pressurizing capabilities. Alternatively, the MEMS assembly 200 may be entirely or substantially manufactured in such a location. In yet another embodiment, when pressurizing is not required or desired, the MEMS assembly 200 may be manufactured at any appropriate station, perhaps already present in conventional manufacturing processes.

Still referring to FIG. 2C, in other embodiments, the protective layer 220 may not have been removed earlier in the manufacturing process. In such embodiments, the protective layer 220 may be stripped and removed through the opening 240, as indicated by arrows $A_1$, perhaps using a supercritical fluid, such as carbon dioxide ($CO_2$) at temperatures greater than 31° C. and pressures greater than 1070 psia. Such an approach is set forth in commonly assigned co-pending patent application Ser. No. 10/454,198, and entitled "Method for Stripping Sacrificial Layer in MEMS Assemblies", which is incorporated herein by reference.

Figure 2D:
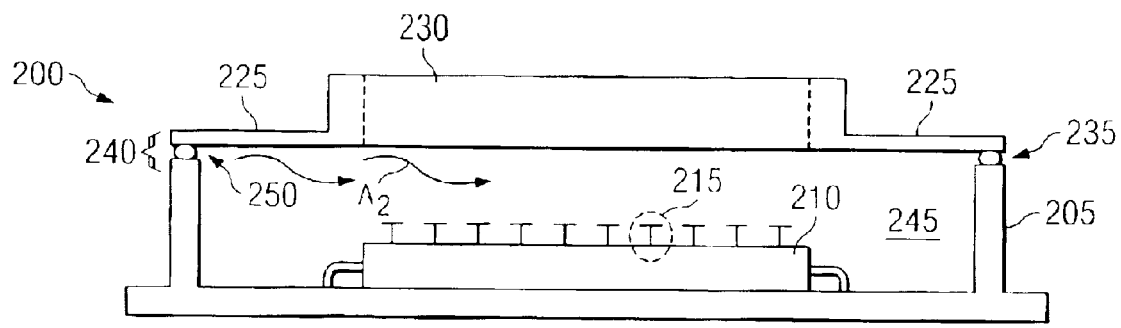
FIG. 2D illustrates the completed MEMS assembly, as constructed according to the principles of the present invention.

Turning now to FIG. 2D, illustrated is the completed MEMS assembly 200, as constructed according to the principles of the present invention. After the removing material is used to remove the protective layer 220, a coating step, for example a passivation and for lubrication step is conducted. More specifically, many types of MEMS assemblies perform best with some type of lubrication around the parts of the MEMS array 210 so as to mitigate or prevent sticking of the mirrors to electrodes, or other similar problems that may affect device performance. In addition, the MEMS array 210 may perform well over long periods of time if passivated to provide protection to its components. As such, the illustrated embodiment provides an opportunity to mix a lubricant or passivant into the ambient 245 of the interior of the MEMS assembly 200. For example, a passivation material, such as perflourodecanoic acid (PFDA), may be introduced into the interior to reach all the necessary places surrounding the MEMS array 210, as indicated by arrows $A_2$. In an advantageous embodiment, both passivation and lubrication are provided by coating the MEMS array 210 with appropriate materials.

In another embodiment, a getter may be included in the interior of the MEMS assembly 200, and, once activated by being saturated by a desired chemical, used to lubricate or passivate the internal components of the MEMS array 210 over the life of the MEMS assembly. Therefore, in such embodiments, a passivation or lubrication material may be introduced through the opening 240 to activate the getter for this purpose. For a more detailed discussion on getter formation in MEMS assemblies, see U.S. Pat. No. 5,610,438, entitled "Micro-Mechanical Device with Non-Evaporable Getter", commonly assigned with the present application, and incorporated herein by reference. However, even if a getter is not employed, passivation or lubrication through the opening 240 in accordance with the principles disclosed herein provides benefits for the MEMS array 210 and other valuable components of the MEMS assembly 200, without exposing those portions of the MEMS assembly 200 to potential contaminants.

In addition, the final ambient 245 may be selected and introduced before the opening 240 is sealed. For example, if a nitrogen-based ambient 245 is desired for the MEMS assembly 200, a nitrogen-rich gas may be introduced into the interior of the assembly 200. With this additional step, the ambient 245 of the MEMS assembly 200 may be specifically selected depending on the intended application of the assembly 200. Additionally, flushing the ambient 245 in this manner may be useful in removing any residual traces of the removal fluid used to strip the sacrificial protective layer 220. Other gases or liquids of varying viscosity or other characteristics may be introduced, as well. Moreover, a specific ambient 245 may be introduced into the interior, and then later flushed, if beneficial to particular applications. Of course, no specific ambient 245 is required to practice the present invention, or the ambient 245 may comprise any elements or compounds without deviating from the scope of the invention disclosed herein.

At the end of the manufacturing process, after the passivation and/or lubrication of the components in the interior of the MEMS assembly 200, the opening 240 is sealed to further protect the MEMS array 210, as well as other components that may be located in the interior of the MEMS assembly 200. In one embodiment, the opening 240 may be sealed by seam-welding 250 around the entire surface where the assembly lid 225 meets the assembly substrate 205. Of course, other techniques for sealing any openings 240 between the two may also be employed to advantage. For example, epoxy or other curable fillers or adhesives may be used to form a seal or to completely enclose the assembly 200. Additionally, a plug may be used to seal the opening 240. The resulting enclosed cavity may be hermetically sealed or not.

In the illustrated embodiment, the assembly substrate 205 is shown as a single, separate substrate on which the MEMS array 210 is mounted. In such embodiments, the assembly lid 225 is also typically a single, separate structure for coupling to the assembly substrate 205. However, in other embodiments, a plurality of MEMS arrays 210 may be formed on a single semiconductor wafer substrate, which is to be sawed or otherwise divided later in the manufacturing process. In this embodiment, the assembly lid 225 may also be comprised of multiple lids on a single wafer substrate, and designed for mounting over each of the MEMS arrays 210 in one step. As a result, the wafer substrate having the assembly lids 225 may be coupled to the wafer substrate having the assembly substrates 205 by means other than by tack-welding. Of course, in accordance with the principles disclosed herein, openings 240 may be maintained between the assembly substrates 205 and the assembly lids 225 for introducing a passivant or lubricant therethrough for coating the MEMS arrays 210 as desired.

Figure 3:
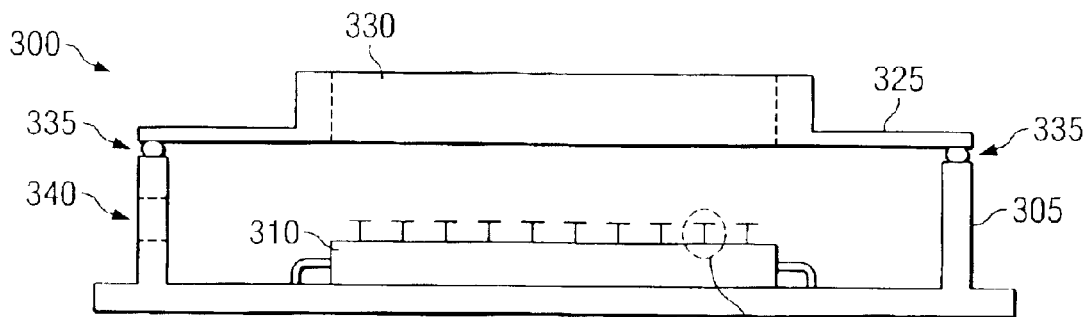
FIG. 3 illustrates a side section view of another embodiment of a MEMS assembly, constructed according to the principles of the present invention.

Looking now at FIG. 3, illustrated is a side section view of another embodiment of a MEMS assembly 300. As shown, the MEMS assembly 300 also includes an assembly substrate 305 on which a MEMS array 310 having a plurality of micro-mirrors 315 is mounted. Once the MEMS array 310 is mounted, an assembly lid 325, having a window 330 for incident light to pass through, is coupled to the assembly substrate 305 and over the MEMS array 310.

However, in this embodiment, the assembly lid 325 is completely sealed to the assembly substrate 305 prior to the coating of the components in the interior of the MEMS assembly 300. As before, the lid 325 may be sealed to the substrate 305 using, for example, seam-welding 335 between the two. Of course, other techniques to couple the two together may also be employed. Although the lid 325 has been sealed to the substrate 305, an opening 340 has been incorporated into the assembly substrate 305 for the purpose of introducing a lubricating or passivating material into the interior in the manner disclosed herein. Alternatively, the opening 340 may be incorporated into the lid 325. Thus, like the opening 240 illustrated in FIG. 2C, the opening 340 in FIG. 3 may be used to coat the MEMS array 310 and other various components, thereby lubricating and/or passivating those components and increasing the overall performance and lifespan of the MEMS assembly 300.

In addition, in embodiments having a getter in the MEMS assembly 300, the engineered opening may be used to activate the getter for continued lubrication of critical components over time. Moreover, in addition to allowing the MEMS assembly 300 to function as intended, passivating the various components through the opening 340 reduces the risk of contamination or other type of damage to the MEMS array 310 typically present during conventional manufacturing processes by not leaving the MEMS array 310 exposed to perform this coating. Furthermore, in those embodiments where the protective layer 320 is removed after the MEMS assembly 300 is tack-welded together, the MEMS array 310 is even more protected since the protective layer 320 is not removed until after the assembly lid 325 is mounted to the assembly substrate 305.

Figure 4:
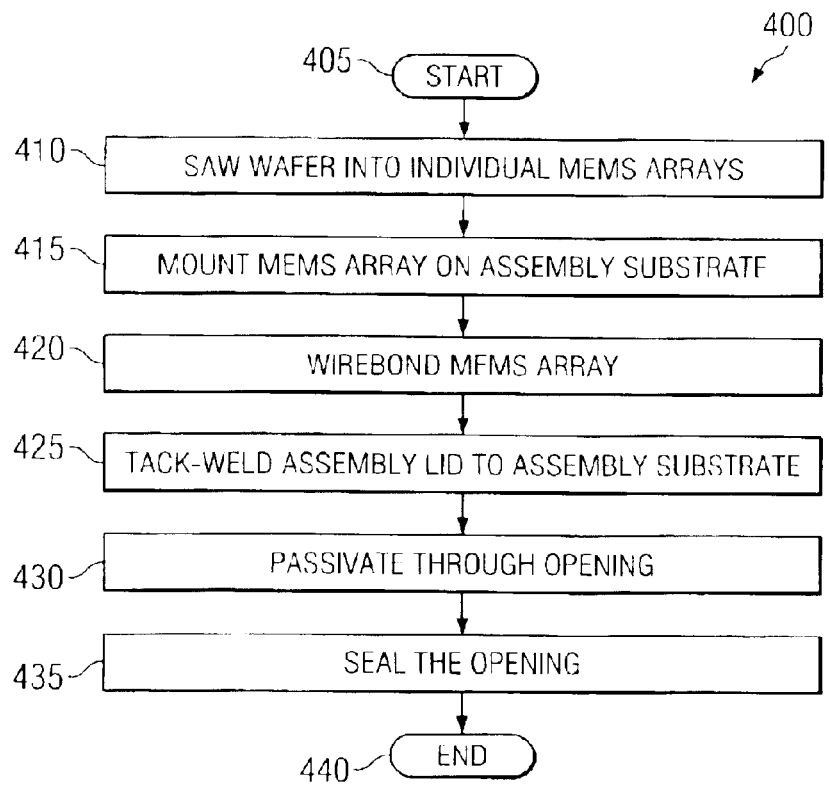
FIG. 4 illustrates a flow diagram of one embodiment of a method for manufacturing MEMS assemblies employing the techniques of the present invention.

Turning finally to FIG. 4, illustrated is a flow diagram 400 of one embodiment of a method for manufacturing MEMS assemblies, such as the assemblies described above, employing the techniques of the present invention. The method begins at a start block 405 where any initial manufacturing stages not directly associated with the principles disclosed herein are performed on the MEMS assembly. For example, the steps employed to manufacture the MEMS array on a semiconductor wafer may be performed in this initial stage of manufacturing.

At block 410, a semiconductor wafer on which multiple MEMS arrays have been formed is sawed into individual arrays. Prior to sawing, the entire wafer is covered with a protective layer, such as the photoresist described above, to protect the MEMS arrays from contaminants, as well as physical, damage during other stages of manufacturing. Known singulation techniques may be used to saw the wafer into the individual arrays.

As the process moves to block 415, an individual MEMS array, cut from the wafer, is mounted onto an assembly substrate. In particular, traces and contact pads associated with the MEMS array are aligned with associated traces and contact pads formed on the assembly substrate. At block 420, wire-bonding is employed to electrically couple those contacts of the MEMS array to the contacts of the assembly substrate. Employable wire-bonding techniques are widely known, and any such technique may be employed with the present process.

Moving on to block 425, the assembly lid is tack-welded to the assembly substrate, to partially couple the two together and create an interior of the MEMS assembly in which the MEMS array is located. By only partially coupling the two together, openings between individual tack-welds remain. The process moves to block 430, where the coating of the components within the MEMS assembly, primarily the MEMS array, is performed. In an exemplary embodiment, a passivant/lubricant is introduced through the opening(s) in the MEMS assembly and in an effort to infiltrate, and thus coat, all areas of its interior. In addition, in embodiments where a getter is formed in the interior of the MEMS assembly, this coating step may be employed to activate the getter to provide lubrication or passivation to the components within the MEMS assembly over the life of the assembly. In either embodiment, however, coating through the opening(s) in accordance with the principles disclosed herein provides for beneficial lubrication/passivation of the MEMS array and other valuable components of the MEMS assembly, without exposing those portions of the MEMS assembly to potential contaminants.

In an alternative embodiment, as discussed in detail above, the lid and substrate may be completely welded together at block 425 of the process, causing a hermitic or other appropriate seal between the two. In such an embodiment, an opening(s), other than one associated with tack-welds between the lid and substrate, is engineered into the substrate or lid. This opening may then be used to coat the interior of the MEMS assembly, at block 430, to lubricate/passivate the vital components located therein. Similarly, the engineered opening may alternatively be used to activate a getter that may be formed in the interior of the MEMS assembly.

At block 435, the opening(s) in the MEMS assembly is filled or otherwise sealed. By sealing the opening(s), the interior of the MEMS assembly is protected from external contaminants. In addition, by sealing the opening(s), the ambient of the interior of the MEMS assembly may be maintained if desired, depending on the particular application. Once the opening(s) is sealed, the process ends at block 440, and the MEMS assembly may then be mounted to a larger DMD device, or otherwise put into operation for its intended application.

By employing any process following the principles disclosed herein, such as those described above with reference to the MEMS assemblies 200, 300 and the exemplary process in FIG. 4, MEMS assemblies, and manufacturing processes for the MEMS assemblies, having significant advantages over those found in the prior art, and produced using conventional techniques, may be manufactured. Specifically, by allowing the MEMS array to be enclosed within the MEMS assembly before lubrication/passivation, the vital components housed within the interior of the MEMS assembly are protected before, during, and after the lubrication/passivation process from contamination in the form of particles and vapors. Thus, as a whole, contamination of the MEMS array and its associated components is reduced or even eliminated during several stages of the manufacturing process.

Furthermore, by reducing the overall exposure time of the MEMS array, as well as other components typically protected by the protective layer, during most of the manufacturing process, the overall risk of contaminants affecting the performance of the MEMS array, or even the chance of human contact with the MEMS array, is reduced or even eliminated. Reducing array contamination results in higher wafer yield, thus reducing overall manufacturing costs by producing a greater number of functional MEMS assemblies per wafer. In addition, in many cases, the disclosed processes involve fewer steps than conventional processes, yet yielding better results. Moreover, the disclosed processes may be incorporated into existing manufacturing processes since mostly standard materials and associated processing steps are employed. Such incorporation may even include processes wherein multiple assembly substrates are initially formed on a single semiconductor wafer, then covered with multiple assembly lids formed on a separate single semiconductor wafer. Furthermore, such incorporation is possible into almost any type of manufacturing process, to manufacture almost any type of optoelectronic or electromechanical device, while still maintaining benefits such as those described above.

While various embodiments of an MEMS assembly constructed according to the principles disclosed herein, have been described above, it should be understood that they have been presented by way of example only, and not limitation. Thus, the breadth and scope of the invention(s) should not be limited by any of the above-described exemplary embodiments, but should be defined only in accordance with the following claims and their equivalents. Moreover, the above advantages and features are effected in described embodiments, but shall not limit the application of the claims to processes and structures accomplishing any or all of the above advantages. It should also be noted that the disclosed principles are not limited merely to the manufacture of a MEMS assembly for use in SLMs and the like. In fact, the disclosed processes, and variations, may be employed in the manufacture of non-mirror based MEMS devices, which may lack windows in the assembly lid discussed above. Moreover, any device having delicate moveable components may benefit from use of the principles disclosed herein.

Additionally, the section headings herein are provided for consistency with the suggestions under 37 CFR 1.77 or otherwise to provide organizational cues. These headings shall not limit or characterize the invention(s) set out in any claims that may issue from this disclosure. Specifically and by way of example, although the headings refer to a "Technical Field of the Invention," the claims should not be limited by the language chosen under this heading to describe the so-called field of the invention. Further, a description of a technology in the "Background of the Invention" is not to be construed as an admission that technology is prior art to any invention(s) in this disclosure. Neither is the "Brief Summary of the Invention" to be considered as a characterization of the invention(s) set forth in the claims set forth herein. Furthermore, the reference in these headings, or elsewhere in this disclosure, to "invention" in the singular should not be used to argue that there is only a single point of novelty claimed in this disclosure. Multiple inventions may be set forth according to the limitations of the multiple claims associated with this disclosure, and the claims accordingly define the invention(s) that are protected thereby. In all instances, the scope of the claims shall be considered on their own merits in light of the specification, but should not be constrained by the headings set forth herein.

What is claimed is:

1. A method of manufacturing a MEMS assembly, comprising:

providing a MEMS device on an assembly substrate;

coupling an assembly lid to the assembly substrate and over the MEMS device to create an interior of the MEMS assembly housing the MEMS device, the coupling maintaining an opening to the interior of the MEMS assembly; and coating the MEMS device through the opening.

2. A method according to claim 1, wherein the coating includes introducing perflourodecanoic acid (PFDA) over and around the MEMS device.

3. A method according to claim 1, further comprising forming a getter in the interior and saturating the getter through the opening.

4. A method according to claim 1, wherein the coupling comprises tack-welding, and wherein the opening comprises spaces between tack-welding beads formed during the tack-welding.

5. A method according to claim 1, wherein the coating comprises lubricating the MEMS device through the opening with a lubricant.

6. A method according to claim 1, wherein the coating comprises passivating the MEMS device through the opening with a passivant.

7. A method according to claim 1, wherein the opening comprises a vent in the assembly substrate.

8. A method according to claim 1, further comprising, before providing the MEMS device on the assembly substrate, forming a protective layer over the MEMS array, and further comprising, before coating the MEMS array through the opening, removing the protective layer through the opening using a supercritical compound inserted through the opening.

9. A method according to claim 1, further comprising sealing the opening after coating the MEMS array through the opening.

10. A method according to claim 1, wherein the providing comprises providing a MEMS device on a separate assembly substrate, and the coupling comprises coupling a separate assembly lid to the assembly substrate and over the MEMS device to create an interior of the MEMS assembly housing the MEMS device.

11. A MEMS assembly constructed according to a process comprising:
    providing a MEMS device on an assembly substrate;
    coupling an assembly lid to the assembly substrate and over the MEMS device to create an interior of the MEMS assembly housing the MEMS device, the coupling maintaining an opening to the interior of the MEMS assembly; and
    coating the MEMS device through the opening.

12. A MEMS assembly according to claim 11, wherein the coating includes introducing perflourodecanoic acid (PFDA) over and around the MEMS device.

13. A MEMS assembly according to claim 11, further comprising forming a getter in the interior and saturating the getter through the opening.

14. A MEMS assembly according to claim 11, wherein the coupling comprises tack-welding, and wherein the opening comprises spaces between tack-welding beads formed during the tack-welding.

15. A MEMS assembly according to claim 11, wherein the coating comprises lubricating the MEMS device through the opening with a lubricant.

16. A MEMS assembly according to claim 11, wherein the coating comprises passivating the MEMS device through the opening with a passivant.

17. A MEMS assembly according to claim 11, wherein the opening comprises a vent in the assembly substrate.

18. A MEMS assembly according to claim 11, further comprising, before providing the MEMS device on the assembly substrate, forming a protective layer over the MEMS device, and further comprising, before coating the MEMS device through the opening, removing the protective layer through the opening using a supercritical compound inserted through the opening.

19. A MEMS assembly according to claim 11, further comprising sealing the opening after coating the MEMS device through the opening.

20. A MEMS assembly according to claim 19, wherein the providing comprises providing a MEMS device on a separate assembly substrate, and the coupling comprises coupling a separate assembly lid to the assembly substrate and over the MEMS device to create an interior of the MEMS assembly housing the MEMS device.

* * * * *